(12) United States Patent
Tamura et al.

(10) Patent No.: US 7,320,898 B2
(45) Date of Patent: Jan. 22, 2008

(54) SEMICONDUCTOR LASER DEVICE AND METHOD FOR FABRICATING THE SAME

(75) Inventors: Satoshi Tamura, Osaka (JP); Norio Ikedo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 307 days.

(21) Appl. No.: 11/154,547

(22) Filed: Jun. 17, 2005

(65) Prior Publication Data

US 2005/0279993 A1 Dec. 22, 2005

(30) Foreign Application Priority Data

Jun. 17, 2004 (JP) .............................. 2004-179264

(51) Int. Cl.
*H01L 21/00* (2006.01)
*H01L 29/06* (2006.01)

(52) U.S. Cl. ............................ 438/22; 438/46; 257/12; 257/94

(58) Field of Classification Search .................. 438/22, 438/29, 42, 44, 46, 47; 257/12, 14, 94, 103
See application file for complete search history.

(56) References Cited

U.S. PATENT DOCUMENTS

| 6,238,947 | B1* | 5/2001 | Shakuda | 438/94 |
| 6,359,919 | B1* | 3/2002 | Ishikawa et al. | 372/45.01 |
| 6,741,623 | B2* | 5/2004 | Ishikawa et al. | 257/103 |
| 7,026,182 | B2* | 4/2006 | Ishikawa et al. | 438/44 |
| 2002/0167018 | A1* | 11/2002 | Nakamura et al. | 257/103 |
| 2005/0194634 | A1* | 9/2005 | Ishikawa et al. | 257/324 |
| 2005/0280022 | A1* | 12/2005 | Ueda et al. | 257/103 |

FOREIGN PATENT DOCUMENTS

JP 08-097507 4/1996

* cited by examiner

*Primary Examiner*—Kevin M. Picardat
(74) *Attorney, Agent, or Firm*—McDermott Will & Emery LLP (57) ABSTRACT

A semiconductor laser device of the present invention includes: an active layer formed on a substrate; a first semiconductor layer formed on the active layer and made of a nitride semiconductor of a first conductivity type; a multilayer film formed on the first semiconductor layer and having a groove; and a second semiconductor layer formed on the multilayer film to fill the groove and made of a nitride semiconductor of the first conductivity type. The multilayer film is composed of a plurality of thin films containing a nitride semiconductor of a second conductivity type, and one of the thin films formed as the uppermost film is made of gallium nitride.

18 Claims, 6 Drawing Sheets

… (Page 1 omitted: patent front matter and specification text)

SEMICONDUCTOR LASER DEVICE AND METHOD FOR FABRICATING THE SAME

CROSS-REFERENCE TO RELATED APPLICATIONS

This application claims priority under 35 U.S.C. §119 on patent application Ser. No. 2004-179264 filed in Japan on Jun. 17, 2004, the entire contents of which are hereby incorporated by reference. The entire contents of patent application Ser. No. 2005-172841 filed in Japan on Jun. 13, 2005 are also incorporated by reference.

BACKGROUND OF THE INVENTION (1) Field of the Invention

The present invention relates to a semiconductor laser device using a nitride semiconductor and a method for fabricating the same.

(2) Description of Related Art

Laser diodes emitting in the blue-violet region of the spectrum are expected as light sources for high-density optical disks, because the diameter of the focused laser spot on the optical disks can be reduced as compared with light diodes emitting in the red and infrared regions and therefore can improve the recording density for the optical disks. Semiconductor laser devices using nitride semiconductors, such as gallium nitride, have now been developed to realize laser diodes in the blue-violet region.

Figure 5:
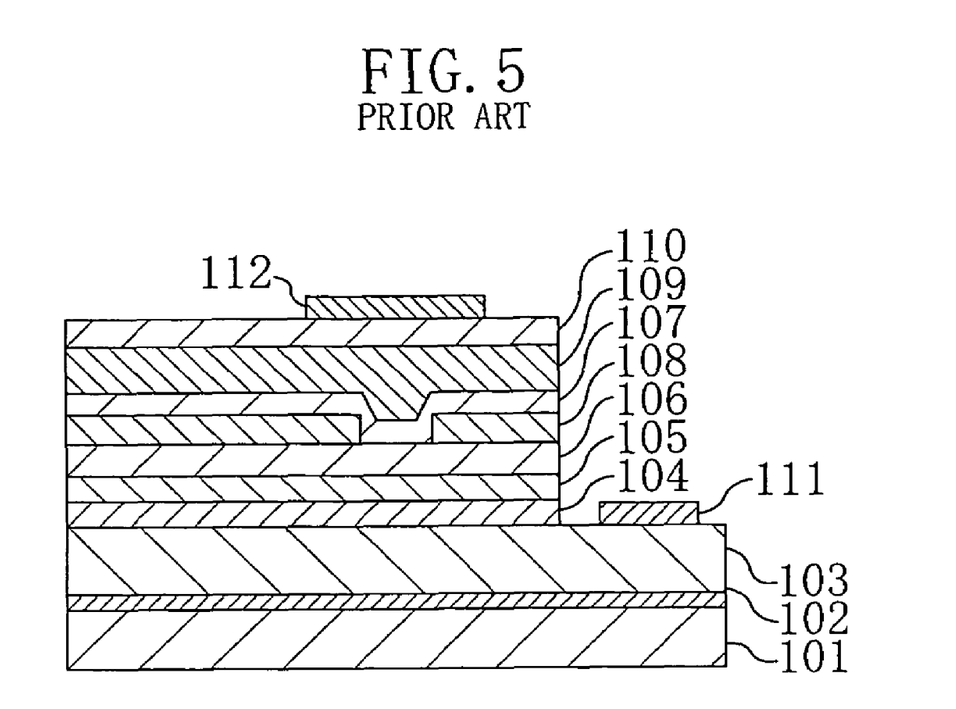
FIG. 5 is a cross-sectional view showing a semiconductor laser device according to a known example.

Devices of the following structure have been suggested as semiconductor laser devices using nitride semiconductors (see Japanese Unexamined Patent Publication No. 8-97507). FIG. 5 shows a cross-sectional structure of a semiconductor laser device according to a known art. As shown in FIG. 5, in a known semiconductor laser device, an n-type cladding layer 103 of n-type aluminum gallium nitride (AlGaN) is formed on a substrate 10 of sapphire with a low-temperature growth buffer layer 102 interposed between the substrate 101 and the n-type cladding layer 103. The following layers are successively stacked on the n-type cladding layer 103 to expose a part of the n-type cladding layer 103: an n-type guide layer 104 of n-type gallium nitride (GaN); an active layer 105 of indium gallium nitride (InGaN) having a multi-quantum well structure; a first p-type guide layer 106 of p-type GaN; a current blocking layer 108 of n-type AlGaN; a second p-type guide layer 107 of p-type GaN; a p-type cladding layer 109 of p-type AlGaN; and a p-type contact layer 110 of p-type GaN. Furthermore, an n-type electrode 111 is formed on an exposed part of the n-type cladding layer 103, and a p-type electrode 112 is formed on the p-type contact layer 110.

A part of the current blocking layer 108 is etched in a stripe, thereby forming a window through which current flows. When voltage is applied between the p-type electrode 112 and the n-type electrode 111, current flows only through the window obtained by removing the part of the current blocking layer 108. Therefore, current can be injected only into a stripe part of the active layer 105 located under the window. Furthermore, the refractive index difference between the current blocking layer 108 and the second p-type guide layer 107 permits the confinement of light emitted from the active layer 105 between the n-type guide layer 104 and the second p-type guide layer 107.

Figure 6A:
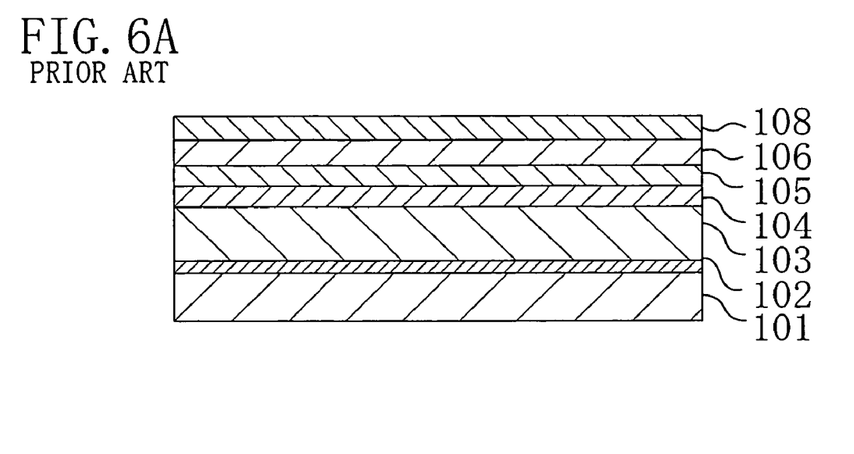
FIGS. 6A through 6C are cross-sectional views showing process steps in a fabrication method for the semiconductor laser device according to the known example in a sequential order.
Figure 6B:
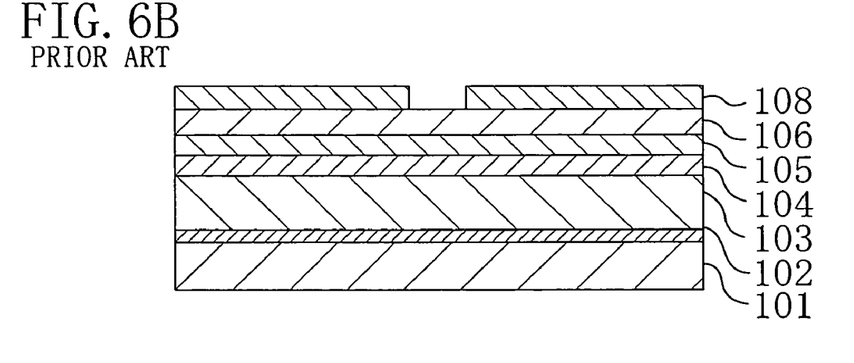
Figure 6C:
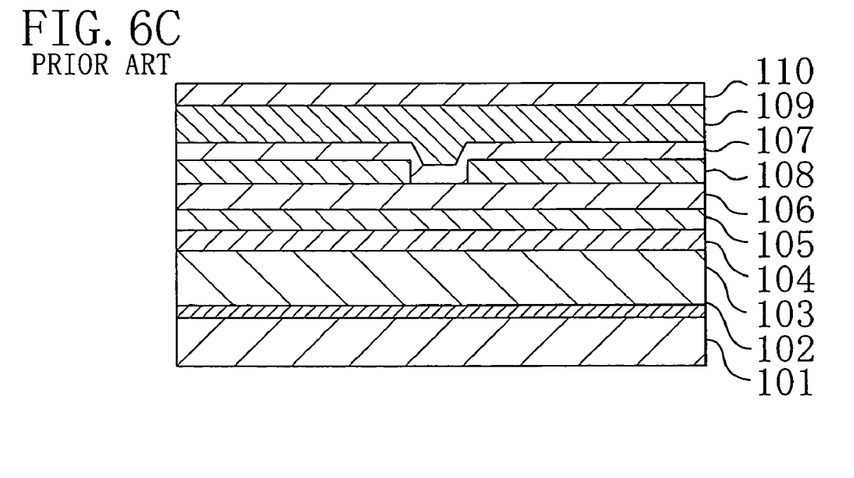

FIGS. 6A through 6C show a method for fabricating such a buried heterostructure semiconductor laser device. First, as shown in FIG. 6A, the first crystal growth is carried out in which a buffer layer 102, an n-type cladding layer 103, an n-type guide layer 104, an active layer 105, a first p-type guide layer 106, and a current blocking layer 108 are successively grown on a substrate 101.

Next, as shown in FIG. 6B, a part of the current blocking layer 108 is selectively removed by etching to form a stripe-like recess serving as a window.

Next, as shown in FIG. 6C, the second crystal growth is carried out in which a p-type guide layer 107, a p-type cladding layer 109 and a p-type contact layer 110 are successively formed on the current blocking layer 108 formed with the recess. Next, a p-type electrode and an n-type electrode are formed by a usual method.

Dry etching using a chloride gas is typically used to form the recess in the current blocking layer 108. If the recess is formed by dry etching, part of the current blocking layer 108 subjected to dry etching, such as an exposed part of the p-type guide layer 106, is damaged, resulting in the increased absorption of emitted light and the deteriorated device characteristics. Therefore, the recess is desirably formed by wet etching.

However, the buried heterostructure semiconductor laser device has the following problems. First, crystal growth need be carried out twice due to the structure of the device, and the second crystal growth need be carried out to the top surface of the current blocking layer 108 of n-type AlGaN except for the window. The regrowth of layers on the layer of AlGaN significantly worsens the surface morphology and crystallinity in early stages of the regrowth. This increases light absorption in part of the grown layers having deteriorated crystallinity, leading to the increased lasing threshold current.

Furthermore, when the p-type guide layer 107 of p-type GaN regrown on the current blocking layer 108 has deteriorated crystallinity, magnesium (Mg) with which the p-type guide layer 107 is doped is likely to diffuse through defects or the like into the active layer 105. When Mg has diffused into the active region 105, a semiconductor laser device using a nitride material has reduced reliability.

Moreover, the recess must be formed by dry etching causing damage to the current blocking layer 108 and other layers, because the current blocking layer 108 of n-type AlGaN can hardly be etched by known wet etching. The damage caused in a substrate region subjected to etching for the formation of the recess is one of factors responsible for the increased lasing threshold current.

SUMMARY OF THE INVENTION

The present invention has been made to solve the aforementioned problems, and an object of the present invention is to improve the crystallinity and surface morphology of a semiconductor layer formed on a current blocking layer and realize a high-reliability semiconductor laser device with a small lasing threshold current.

In order to achieve the above-mentioned object, the semiconductor laser device of the present invention has a structure in which the current blocking layer is a multilayer film having gallium nitride as the uppermost layer.

To be specific, a semiconductor laser device comprises: an active layer formed on a substrate; a first semiconductor layer formed on the active layer and made of a nitride semiconductor of a first conductivity type; a multilayer film formed on the first semiconductor layer to have a groove and obtained by stacking a plurality of thin films containing a nitride semiconductor of a second conductivity type, the uppermost one of said thin films being made of gallium nitride; and a second semiconductor layer formed on the multilayer film to fill the groove and made of a nitride semiconductor of the first conductivity type.

According to the semiconductor laser device of the present invention, when the second semiconductor layer is regrown on the multilayer film, the second semiconductor layer with excellent crystallinity and excellent surface morphology can be formed thereon. This can suppress light absorption in the second semiconductor layer. As a result, a semiconductor laser device with a small lasing threshold current can be realized. Furthermore, the semiconductor laser device of the present invention can restrain impurities with which the second semiconductor layer is doped from diffusing into the active layer, resulting in the improved reliability of the semiconductor laser device.

In the semiconductor laser device of the present invention, it is preferable that at least one of the thin films constituting the multilayer film contains aluminum and the thin film containing aluminum has a lower concentration of impurities of the second conductivity type than the thin film made of gallium nitride. The thin film containing aluminum may be made of an undoped nitride semiconductor. This structure can restrain cracks from being caused in the thin film containing aluminum, resulting in the enhanced yields.

In the semiconductor laser device of the present invention, the thin film containing aluminum is preferably made of a compound expressed by the general formula $Al_xGa_{1-x}N$ ($0<x\leq 1$).

In the semiconductor laser device of the present invention, the thin film made of gallium nitride preferably has a thickness of 5 nm through 0.3 μm both inclusive. This structure facilitates control over the thickness of the thin film made of gallium nitride and increases productivity because of a smooth surface of the multilayer film after the formation of the groove.

In the semiconductor laser device of the present invention, the second semiconductor layer preferably has a larger refractive index than one of the thin films having the smallest refractive index. With this structure, emitted light can certainly be blocked by the interface between the second semiconductor layer and the multilayer film and thus confined between the first semiconductor layer and the second semiconductor layer.

A method for fabricating a semiconductor laser device of the present invention comprises the steps of: successively forming an active layer, a first semiconductor layer made of a nitride semiconductor of a first conductivity type and a multilayer film made of a plurality of thin films containing a nitride semiconductor of a second conductivity type, the uppermost one of said thin films being made of gallium nitride; forming a groove by selectively removing a part of the multilayer film; and forming a second semiconductor layer made of the nitride semiconductor of the first conductivity type on the multilayer film formed with the groove.

According to the method for fabricating a semiconductor laser device of the present invention, the second semiconductor layer can be improved in crystallinity and surface morphology. Therefore, light absorption in the second semiconductor layer is reduced. As a result, a semiconductor laser device with a small lasing threshold current can be realized. Furthermore, the semiconductor laser device of the present invention can restrain impurities with which the second semiconductor layer is doped from diffusing into the active layer, resulting in the improved reliability of the semiconductor laser device.

In the method of the present invention, it is preferable that at least one of the thin films constituting the multilayer film contains aluminum and the thin film containing aluminum has a lower concentration of impurities of the second conductivity than the thin film made of gallium nitride.

In this case, the thin film containing aluminum is preferably made of a compound expressed by the general formula $Al_xGa_{1-x}N$ ($0<x\leq 1$).

In the method of the present invention, it is preferable that in the step of forming the groove, a metal mask is formed on the thin film made of gallium nitride and then the multilayer film is subjected to wet etching using the formed metal mask. With this structure, the multilayer film can be etched without causing damage to the multilayer film. This can prevent emitted light from being absorbed in the multilayer film.

In this case, the metal mask preferably makes ohmic contact with the thin film made of gallium nitride. The metal mask is preferably made of titanium or tantalum. Furthermore, it is preferable that in wet etching, a metal film made of a metal less likely to be ionized than hydrogen is formed on the top surface of the metal mask. The metal less likely to be ionized than hydrogen is preferably platinum. With this structure, a mask can be formed on the entire surface of a wafer to perform wet etching.

In the method of the present invention, it is preferable that in the step of forming the groove, wet etching is performed while light having higher energy than the thin film of the multilayer film having a larger band gap than the other thin films thereof is applied to the multilayer film.

In the method of the present invention, in the wet etching, alkaline solution is preferably used as etchant, and the alkaline solution is preferably aqueous potassium hydroxide or aqueous sodium hydroxide.

DETAILED DESCRIPTION OF THE INVENTION

Figure 1:
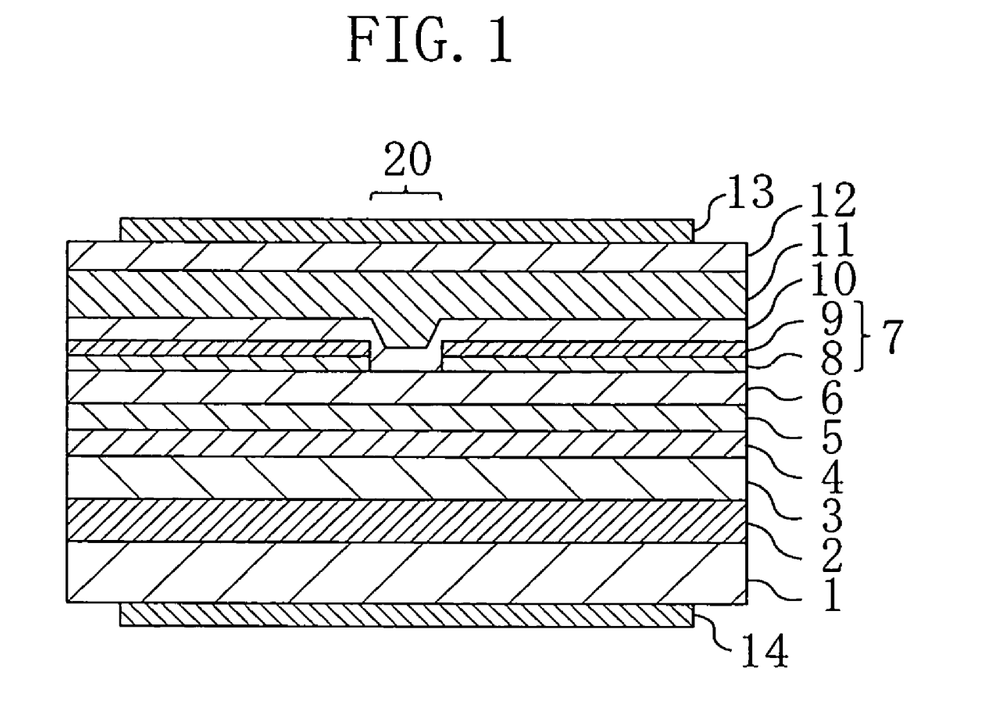
FIG. 1 is a cross-sectional view showing a semiconductor laser device according to a first embodiment of the present invention.

A semiconductor laser device according to a first embodiment of the present invention will be described with reference to the drawings. FIG. 1 shows a cross-sectional structure of the semiconductor laser device according to the first embodiment. As shown in FIG. 1, an n-type GaN layer 2 is formed on a 2-inch substrate 1 made of GaN. The following layers are successively stacked on the GaN layer 2: an n-type cladding layer 3 of n-type $Al_{0.06}Ga_{0.94}N$; an n-type guide layer 4 of n-type GaN; an active layer 5 of InGaN having a multi-quantum well structure; and a first p-type guide layer 6 of p-type GaN.

A current blocking layer 7 is formed on the first p-type guide layer 6 to have a groove obtained by etching a part of the current blocking layer 7 in a stripe. The current blocking layer 7 is obtained by successively stacking an n-type $Al_{0.15}Ga_{0.85}N$ layer 8 and an n-type GaN layer 9. A second p-type guide layer 10 of p-type GaN is formed on a part of the first p-type guide layer 6 exposed at the bottom of the groove and the GaN layer 9. The groove serves as a window 20 through which current flows. A cladding layer 11 of p-type $Al_{0.06}Ga_{0.94}N$ and a contact layer 12 of p-type GaN are successively formed on the second p-type guide layer 10. While a p-type electrode 13 made of a material having nickel (Ni) as the main ingredient is formed on the p-type GaN contact layer 12, an n-type electrode 14 made of a material having titanium (Ti) as the main ingredient is formed immediately below the back surface of the GaN substrate 1. Although in this embodiment GaN is used for a substrate, sapphire or other materials may be used therefor.

Since the n-type current blocking layer 7 is formed between the first p-type guide layer 6 and the second p-type guide layer 10, pn junctions are formed at the interface between the first p-type guide layer 6 and the n-type current blocking layer 7 and the interface between the second p-type guide layer 10 and the n-type current blocking layer 7. The current blocking layer 7 blocks currents by energy gap differences at the interfaces of both the pn junctions. Therefore, when voltage is applied between the p-type electrode 13 and the n-type electrode 14, current is injected into the active layer 5 only from the window 20 obtained by etching a part of the current blocking layer 7 in a stripe. The refractive index difference between the n-type $Al_{0.15}Ga_{0.85}N$ layer 8 and the second p-type guide layer 10 permits the confinement of emitted light therebetween. In this way, laser light is produced which is guided through a region of the active layer 5 located under the window 20.

A fabrication method for a semiconductor laser device according to the first embodiment will be described hereinafter. FIGS. 2A through 2D show cross-sectional structures of the semiconductor laser device according to this embodiment in the corresponding fabrication process steps in a sequential order.

Figure 2A:
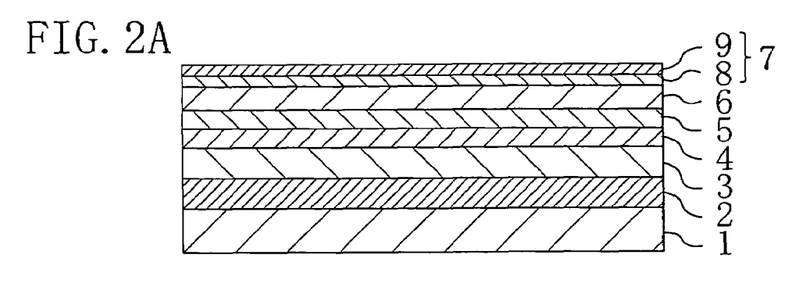
FIGS. 2A through 2D are cross-sectional views showing process steps in a fabrication method for the semiconductor laser device according to the first embodiment of the present invention in a sequential order.

First, as shown in FIG. 2A, the following layers are successively grown on a substrate 1 of GaN using a metal organic vapor phase epitaxy (MOVPE) apparatus: a 2-μm-thick n-type GaN layer 2; a 1-μm-thick n-type cladding layer 3 of n-type $Al_{0.06}Ga_{0.94}N$; a 0.2-μm-thick n-type guide layer 4 of n-type GaN; an active layer 5 of InGaN having a multi-quantum well structure; a 0.1-μm-thick first p-type guide layer 6 of p-type GaN; and a current blocking layer 7. The current blocking layer 7 is formed by successively growing a 0.15-μm-thick $Al_{0.15}Ga_{0.85}N$ layer 8 and a 0.05-μm-thick GaN layer 9.

In the deposition of each layer, trimethyl gallium, trimethyl aluminum and trimethyl indium are used as a gallium material, an aluminum material and an indium material, respectively, and ammonia ($NH_3$) is used as a nitrogen material. In the introduction of silicon (Si) acting as a donor impurity into the n-type cladding layer 3, n-type guide layer 4, the $Al_{0.15}Ga_{0.85}N$ layer 8, and the GaN layer 9, a hydrogen gas ($H_2$) is used as a carrier gas, and monosilane ($SiH_4$) is used as a material. In the introduction of magnesium (Mg) acting as an acceptor impurity into the first p-type guide layer 6, $H_2$ is used as a carrier gas, and cyclopentadienyl magnesium is used as a material.

Figure 2B:
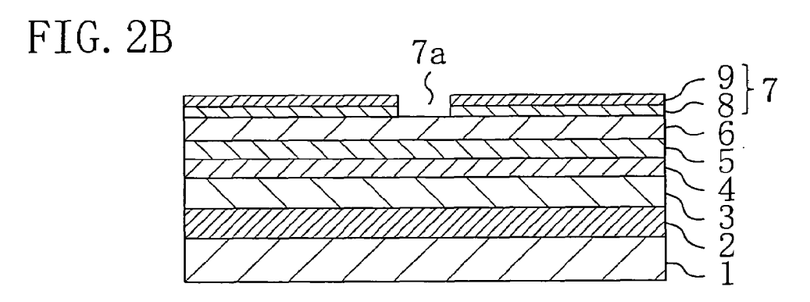

Next, as shown in FIG. 2B, a part of the current blocking layer 7 is etched in a stripe to form an about-2.0-μm-wide groove 7a serving as a window 20. A method for etching the part of the current blocking layer 7 will be described later.

Figure 2C:
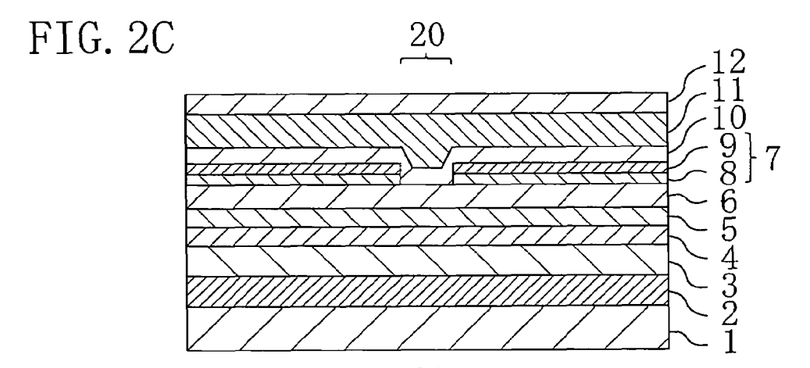

Next, as shown in FIG. 2C, semiconductor layers are regrown on the GaN layer 9 and a part of the first p-type guide layer 6 exposed by etching. More particularly, a 0.1-μm-thick second p-type guide layer 10 of p-type GaN, a 0.5-μm-thick p-type cladding layer 11 of p-type $Al_{0.06}Ga_{0.94}N$, and a 0.1-μm-thick p-type contact layer 12 of p-type GaN are successively grown thereon.

After the growth of each layer, activation annealing is performed in a nitrogen atmosphere at 780° C. for 20 minutes to reduce the resistance of the p-type layer.

Figure 2D:
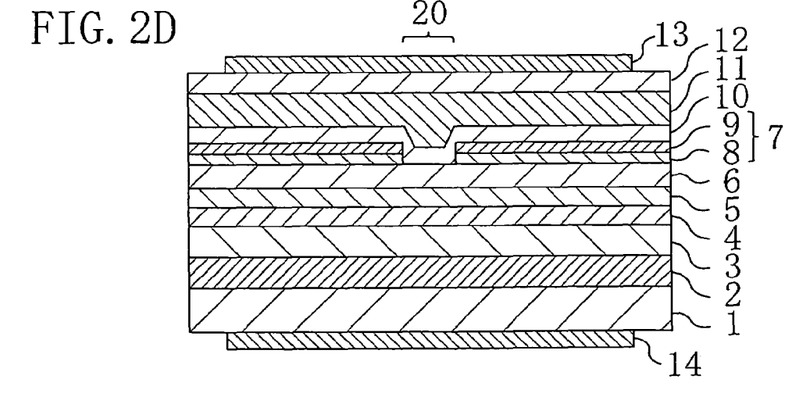

Next, as shown in FIG. 2D, a p-type electrode 13 of a Ni material is formed on the p-type contact layer 12. Subsequently, sintering is performed in a nitrogen atmosphere at 650° C. for 30 minutes.

After the formation of the p-type electrode 13, the GaN substrate 1 is polished to have a thickness of about 150 μm. Thereafter, an n-type electrode 14 of a Ti material is formed immediately below the back surface of the GaN substrate 1. Subsequently, sintering is performed in a nitrogen atmosphere at 600° C. for 30 seconds.

After the formation of the n-type electrode 14, the substrate is cleaved so that a real refractive index guided self-aligned (RISA) type semiconductor laser device for emitting blue-violet light having a wavelength of 405 nm can be obtained.

As described above, since in the semiconductor laser device of this embodiment the current blocking layer 7 has a multilayer structure of the $Al_{0.15}Ga_{0.85}N$ layer 8 and the GaN layer 9, crystals are regrown on the GaN layer 9 and the exposed part of first p-type guide layer 6. Therefore, more excellent crystallinity is realized also in the early stages of the crystal growth as compared with when crystals are regrown on the AlGaN layer as in the known art. This can reduce the absorption of emitted light in the second p-type guide layer 10 or other layers, leading to the reduced lasing threshold current of the semiconductor laser device.

Figure 3A:
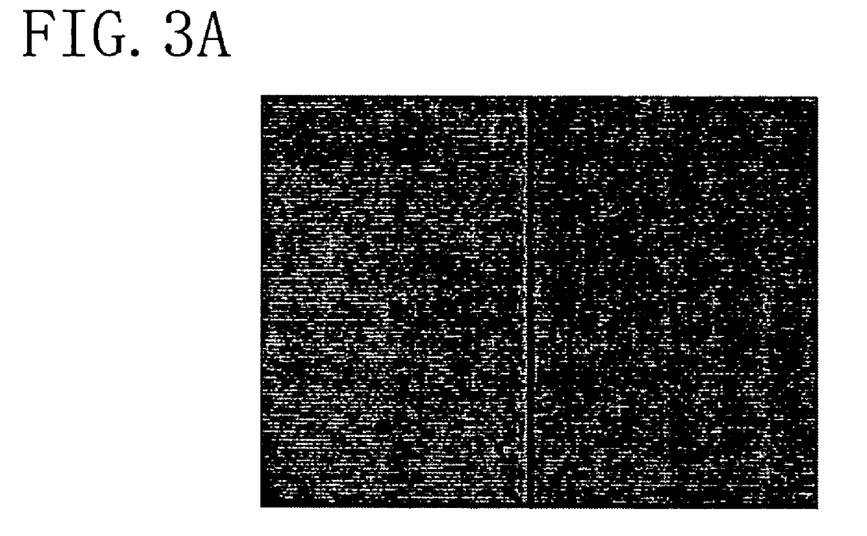
FIGS. 3A and 3B are electron microphotographs showing, for comparison, the surface of a semiconductor layer formed in the fabrication method for the semiconductor laser device according to the first embodiment of the present invention and the surface of a semiconductor layer formed in a known method.
Figure 3B:
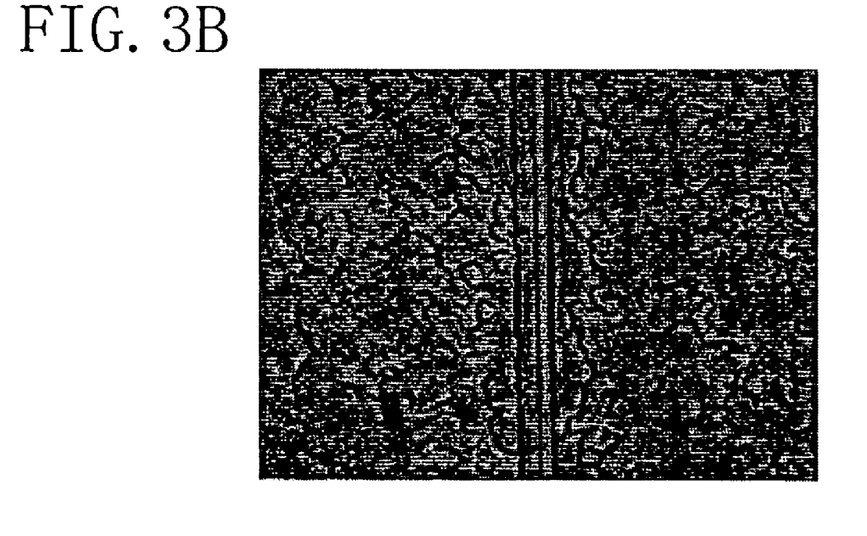

FIGS. 3A and 3B show, for comparison, the state of a semiconductor layer regrown on a current blocking layer in the laser device of this embodiment and the state of a semiconductor layer regrown on a known current blocking layer made of only an AlGaN layer in a known laser device, respectively. Note that in order to check morphologies in the early stages of the growth, comparison is made, not between actual device structures, but between surface morphologies of both devices in which only p-type guide layers have been regrown on their current blocking layers, respectively.

As shown in FIG. 3B, when the semiconductor layer is regrown on the known current blocking layer made of only an AlGaN layer, the surface of the semiconductor layer is deteriorated in morphology and becomes wavy. On the other hand, as shown in FIG. 3A, when the semiconductor layer is regrown on the current blocking layer of this embodiment, the semiconductor layer is formed to have a flat surface. This makes it apparent that in the semiconductor laser device of this embodiment, a semiconductor layer with excellent crystallinity can be regrown on the current blocking layer 7.

Furthermore, it has been known that in the known semiconductor laser device, the diffusion of Mg into an active layer reduces the reliability of the semiconductor laser device. It is considered that the deteriorated crystallinity of the semiconductor layer is likely to cause the diffusion of Mg into the active layer through defects or the like. However, since in the semiconductor laser device of this embodiment each layer regrown on the current blocking layer 7 is improved in crystallinity, Mg hardly diffuses into the active layer, leading to the enhanced reliability.

In order to block current by utilizing the energy difference arising from the pn junctions, the current blocking layer 7 need have a conductivity type opposite to those of layers located immediately thereabove and therebelow and be doped to have an n-type conductivity. In spite of this, an AlGaN layer heavily doped with Si is likely to cause cracks. On the other hand, since in the semiconductor laser device of this embodiment the current blocking layer 7 is formed of the $Al_{0.15}Ga_{0.85}N$ layer 8 and the GaN layer 9, this can increase the doping concentration of the GaN layer 9 while decreasing the doping concentration of the $Al_{0.15}Ga_{0.85}N$ layer 8. This structure can suppress the generation of cracks and improve the yield of semiconductor laser devices. Alternatively, the $Al_{0.15}Ga_{0.85}N$ layer 8 may be undoped. In this case, the generation of cracks can be further suppressed.

Dry Etching

A description will be given below of a method in which dry etching is used to form a groove 7a in a current blocking layer 7 formed of an $Al_{0.15}Ga_{0.85}N$ layer 8 and a GaN layer 9.

After the formation of the current blocking layer 7, a mask is formed on the current blocking layer 7 using a photo resist or the like to have a stripe-like opening.

Thereafter, a substrate 1 is put on a cathode plate in an etching chamber, and the pressure in the etching chamber is reduced by a vacuum pump. After the in-chamber pressure becomes stable, plasmas are generated by applying high-frequency power to electrodes in the etching chamber while introducing a chlorine gas into the chamber. With this method, the current blocking layer 7 with a thickness of 0.2 µm can be etched to form the groove 7a, resulting in a part of the first p-type guide layer 6 exposed at the bottom of the groove 7a.

Thereafter, the substrate 1 is taken out of the etching chamber, and the mask is removed by ashing. Then, crystals are regrown using an MOVPE apparatus.

When the groove 7a is formed by dry etching, this enhances the production efficiency because of a simple operation and a short etching time.

Wet Etching

A description will be given below of a method of use of wet etching when a groove 7a is formed in a current blocking layer 7 formed of an $Al_{0.15}Ga_{0.85}N$ layer 8 and a GaN layer 9.

Figure 4A:
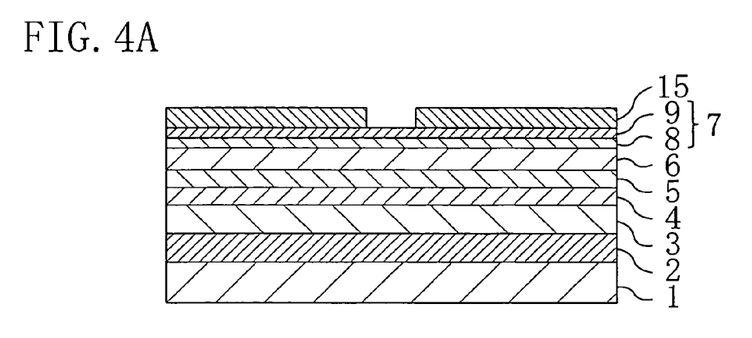
FIGS. 4A and 4B are cross-sectional views showing wet etching process steps in a fabrication method for the semiconductor laser device according to the first embodiment of the present invention in a sequential order.

FIGS. 4A and 4B show process steps for wet-etching the current blocking layer 7 step by step. First, as shown in FIG. 4A, after the current blocking layer 7 formed of the $Al_{0.15}Ga_{0.85}N$ layer 8 and the GaN layer 9 is grown, a metal mask 15 is formed on the GaN layer 9. The metal mask 15 is made of titanium (Ti) and makes ohmic contact with the GaN layer 9. Materials for the metal mask 15 include any materials that can form an ohmic junction with the GaN layer 9. Instead of Ti, tantalum (Ta) or other suitable metal may be used as the metal mask 15.

Figure 4B:
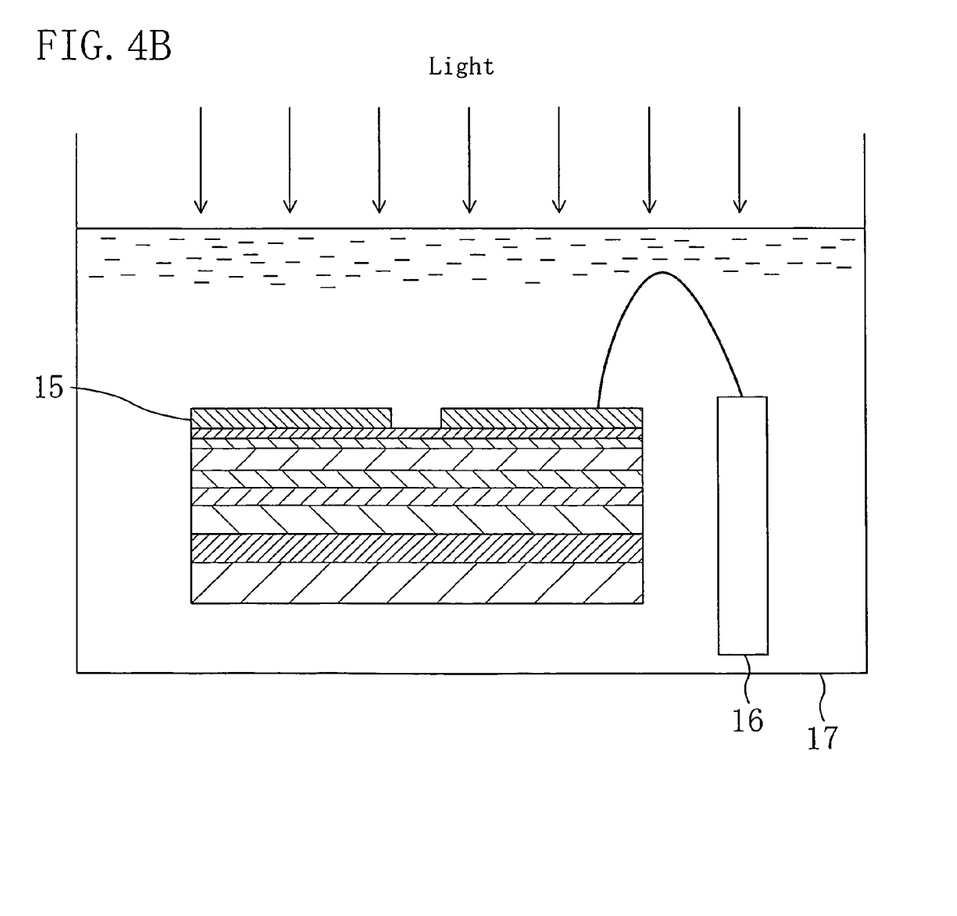

Next, as shown in FIG. 4B, the metal mask 15 and a cathode 16 of platinum (Pt) are connected through a wire to each other and thereafter immersed in aqueous potassium hydroxide 17. In this case, light is applied to the GaN layer 9. Light that can be used for the application is light having higher energy than respective band gap energies of layers constituting the current blocking layer 7. For example, when the current blocking layer 7 is formed of an $Al_{0.15}Ga_{0.85}N$ layer 8 and a GaN layer 9, ultraviolet light of a wavelength having higher energy than the band gap energy of the $Al_{0.15}Ga_{0.85}N$ layer 8 need be applied to the current blocking layer 7.

The light irradiation allows the current blocking layer 7 to absorb the light, resulting in electrons and holes generated in the current blocking layer 7. The holes react with a nitride semiconductor constituting the current blocking layer 7 while the electrons are released from the cathode 16 into the aqueous potassium hydroxide 17. Therefore, the current blocking layer 7 is etched.

In the known semiconductor laser device, the metal mask 15 must be formed on $Al_{0.15}Ga_{0.85}N$, because the current blocking layer 7 is made of only $Al_{0.15}Ga_{0.85}N$. An electric potential barrier is likely to be produced between $Al_{0.15}Ga_{0.85}N$ and the metal mask 15, because $Al_{0.15}Ga_{0.85}N$ has a larger band gap than GaN and hardly forms an ohmic junction with the metal mask 15. In view of the above, it is considered that electrons produced by light irradiation cannot go beyond the electric potential barrier and thus the electrons are hardly released from the cathode 16 into the aqueous potassium hydroxide 17, leading to the suppression of the etching of the current blocking layer 7.

Since in this embodiment the current blocking layer 7 is formed of two layers, i.e., the $Al_{0.15}Ga_{0.85}N$ layer 8 and the GaN layer 9, the groove 7a can be formed by wet etching, thereby suppressing the damage caused in the semiconductor layer. This can reduce the light absorption loss, further reduce the lasing threshold current and permits high-power operation.

In this embodiment, the metal mask 15 is made of only Ti, and the metal mask 15 and the cathode 16 made of Pt are electrically connected through the wire to each other. With this structure, when the entire surface of a wafer on which a plurality of chips are formed is to be etched, a metal mask 15 formed on the entire wafer surface need be electrically connected to the cathode 16. Therefore, the mask pattern is restricted. In order to solve this, the metal mask 15 need be composed of a multilayer film of Ti and Pt by forming Pt on the top surface of the metal mask 15. In this way, the metal mask 15 itself should become a cathode. This structure eliminates the need for connecting the metal mask 15 to the cathode 16. As a result, the entire surface of the wafer can be etched by an arbitrary mask pattern.

A metal less likely to be ionized than hydrogen need be used as the cathode. Gold or the like may be used instead of platinum. Furthermore, alkaline solution need be used as wet etchant. Aqueous sodium hydroxide or the like may be used instead of aqueous potassium hydroxide.

Although in this embodiment the current blocking layer 7 is a multilayer film obtained by stacking the $Al_{0.15}Ga_{0.85}N$ layer 8 and the GaN layer 9, it need only be a multilayer film of a layer made of a compound expressed by the general formula $Al_xGa_{1-x}N$ ($0<x\leq1$) and a GaN layer. In this case, x is preferably 0.4 or less in consideration of facilitation of the film formation. Furthermore, in order to increase the refractive index difference between the current blocking layer 7 and the second p-type guide layer 10 and enhance the efficiency at which emitted light is confined between the n-type guide layer 4 and the second p-type guide layer 10, x is preferably 0.1 or more. Alternatively, the current blocking layer 7 may be a three-or-more-layer multilayer film having a GaN layer as the uppermost layer.

Although in this embodiment the GaN layer 9 has a thickness of 50 nm, it need only have a thickness of 5 nm through 0.3 µm both inclusive. When the GaN layer 9 has a thickness of 50 nm or more, this facilitates control over the thickness of the GaN layer 9 in the growth thereof. This permits the formation of the GaN layer 9 with excellent reproducibility, resulting in enhanced yields. When the GaN layer 9 has a thickness of 0.3 μm or less, this can reduce asperities formed at the top surface of the current blocking layer 7 after the etching thereof. In this way, a recess is hardly left at the top surface of the regrown semiconductor layer. This can restrain a resist from being left on the top surface of the semiconductor layer in a lithography process step.

In particular, when the GaN layer 9 has a thickness of 10 nm or more, an ohmic junction can more certainly be formed between the metal mask 15 and the GaN layer 9. When the GaN layer 9 is formed to have a thickness of 100 nm or less, this further facilitates controlling the oscillation of the semiconductor laser device to obtain a transverse mode.

As described above, the semiconductor laser device and its fabrication method of the present invention provides a high-reliability buried heterostructure semiconductor laser device that can improve the crystallinity and surface morphology of the semiconductor layer formed on the current blocking layer and have a small lasing threshold current and the fabrication method for the same, and is useful as a semiconductor laser device using a nitride semiconductor and a fabrication method for the same.

What is claimed is:

1. A method for fabricating a semiconductor laser device, said method comprising the steps of:
    successively forming an active layer, a first semiconductor layer made of a nitride semiconductor of a first conductivity type and a multilayer film made of a plurality of thin films containing a nitride semiconductor of a second conductivity type, the uppermost one of said thin films being gallium nitride;
    forming a groove by selectively removing a part of the multilayer film; and
    forming a second semiconductor layer made of the nitride semiconductor of the first conductivity type on the multilayer film formed with the groove.

2. The method of claim 1, wherein
    at least one of the thin films constituting the multilayer film is a thin film containing aluminum other than the upper most one of said thin films, and
    the thin film containing aluminum has a lower concentration of impurities of the second conductivity than the upper most one of said thin films.

3. The method of claim 2, wherein
    the thin film containing aluminum is made of a compound expressed by the general formula $Al_xGa_{1-x}N(0<x\leq1)$.

4. The method of claim 1, wherein
    in the step of forming the groove, a metal mask is formed on the upper most one of said thin films, and then the multilayer film is subjected to wet etching using the formed metal mask.

5. The method of claim 4, wherein
    the metal mask makes ohmic contact with the upper most one of said thin films.

6. The method of claim 4, wherein
    the metal mask is made of titanium or tantalum.

7. The method of claim 4, wherein
    in the step of forming the groove, a metal film made of a metal less likely to be ionized than hydrogen is formed on the top surface of the metal mask after the formation of the metal mask.

8. The method of claim 7, wherein
    the metal less likely to be ionized than hydrogen is platinum.

9. The method of claim 4, wherein
    in the step of forming the groove, wet etching is performed while light having higher energy than the thin film of the multilayer film having a larger band gap than the other thin films thereof is applied to the multilayer film.

10. The method of claim 4, wherein
    in the wet etching, alkaline solution is used as etchant.

11. The method of claim 10, wherein
    the alkaline solution is aqueous potassium hydroxide or aqueous sodium hydroxide.

12. A semiconductor laser device comprising:
    an active layer formed on a substrate;
    a first semiconductor layer formed on the active layer and made of a nitride semiconductor of a first conductivity type;
    a multilayer film formed on the first semiconductor layer to have a groove and obtained by stacking a plurality of thin films containing a nitride semiconductor of a second conductivity type, the uppermost one of said thin films being gallium nitride; and
    a second semiconductor layer formed on the multilayer film to fill the groove and made of a nitride semiconductor of the first conductivity type.

13. The device of claim 12, wherein
    at least one of the thin films constituting the multilayer film is a thin film containing aluminum other than the upper most one of said thin films, and
    the thin film containing aluminum has a lower concentration of impurities of the second conductivity type than the upper most one of said thin films.

14. The device of claim 13, wherein
    the thin film containing aluminum is made of an undoped nitride semiconductor.

15. The device of claim 13, wherein
    the thin film containing aluminum is made of a compound expressed by the general formula $Al_xGa_{1-x}N(0<x\leq1)$.

16. The device of claim 12, wherein
    the upper most one of said thin films has a thickness of 5 nm through 0.3 μm both inclusive.

17. The device of claim 12, wherein
    the second semiconductor layer has a larger refractive index than one of the thin films having the smallest refractive index than one of the thin films having the smallest refractive index.

18. The method of claim 15, wherein
    the thin film containing aluminum is made of a compound expressed by the general formula $Al_xGa_{1-x}N$ $(0.1\leq x\leq0.4)$.

* * * * *